(12) United States Patent
Soltanian et al.

(10) Patent No.: US 7,292,115 B2
(45) Date of Patent: Nov. 6, 2007

(54) METHOD TO DIFFERENTIALLY CONTROL LC VOLTAGE-CONTROLLED OSCILLATORS

(75) Inventors: Babak Soltanian, New York, NY (US); Herschel Ainspan, New Hempstead, NY (US); Daniel Friedman, Sleepy Hollow, NY (US); Woogeun Rhee, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 11/112,527

(22) Filed: Apr. 22, 2005

(65) Prior Publication Data

US 2006/0238265 A1    Oct. 26, 2006

(51) Int. Cl.
*H03B 5/08* (2006.01)
(52) U.S. Cl. ............... 331/167; 331/36 C; 331/117 R; 331/177 V
(58) Field of Classification Search ............ 331/117 R, 331/133, 167, 36 C, 177 V
See application file for complete search history.

(56) References Cited

U.S. PATENT DOCUMENTS

| | | | | |
|---|---|---|---|---|
| 5,818,306 A | * | 10/1998 | Lee et al. | 331/117 FE |
| 6,650,195 B1 | * | 11/2003 | Brunn et al. | 331/177 V |
| 6,717,478 B1 | * | 4/2004 | Kim et al. | 331/57 |
| 7,005,936 B2 | * | 2/2006 | Tanzawa | 331/176 |
| 7,026,883 B2 | * | 4/2006 | Muthali et al. | 331/183 |

\* cited by examiner

*Primary Examiner*—Robert Pascal
*Assistant Examiner*—Levi Gannon
(74) *Attorney, Agent, or Firm*—Harrington & Smith, PC

(57) ABSTRACT

A method of differentially controlling an LC voltage controlled oscillator (VCO) includes providing an LC-VCO comprising at least one inductor, measuring an inductor common voltage (CMV) output at a point along the at least one inductor, utilizing the measured inductor CMV as an input to a charge pump, and outputting from the charge pump a plurality of differential control voltages to control an output of the LC-VCO.

20 Claims, 5 Drawing Sheets

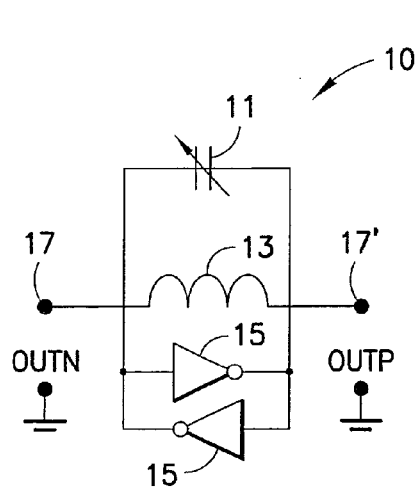
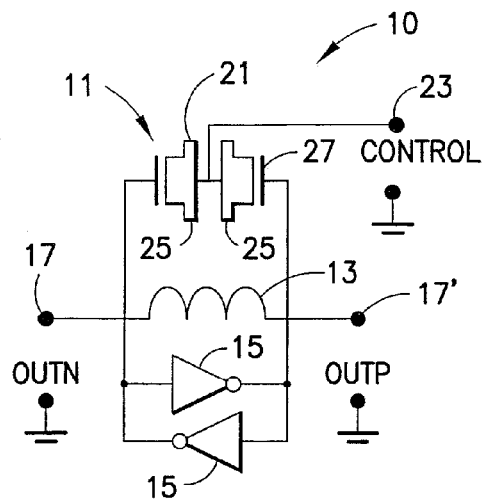
FIG.1
PRIOR ART
FIG.2
PRIOR ART
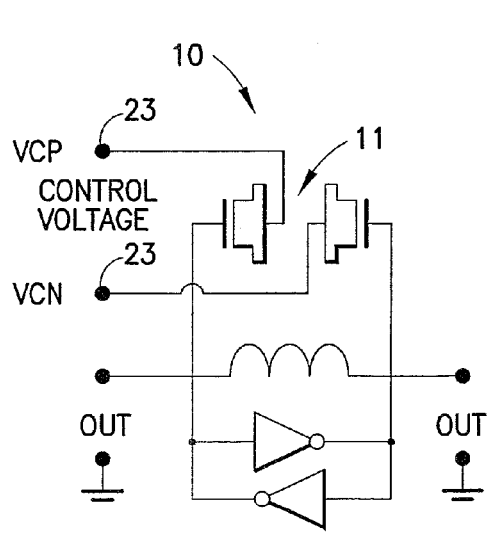
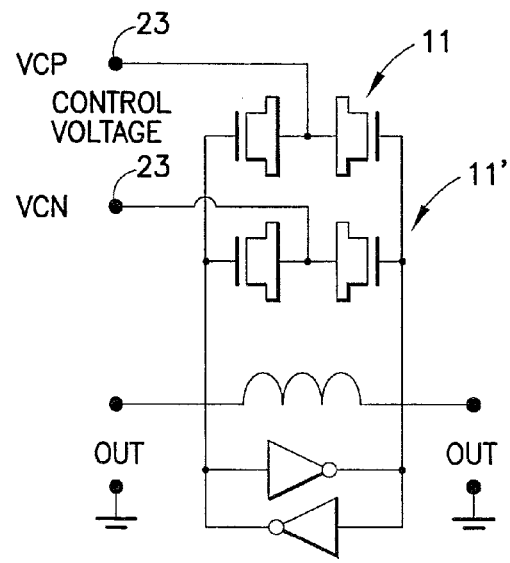
FIG.3a
PRIOR ART
FIG.3b
PRIOR ART

US 7,292,115 B2

METHOD TO DIFFERENTIALLY CONTROL LC VOLTAGE-CONTROLLED OSCILLATORS

This Invention was made with Government support under Contract No.: H98230-04-C-0920 awarded by the National Science Foundation. The Government has certain rights in this invention.

FIELD OF THE INVENTION

This invention relates generally to a method and apparatus for controlling the output frequency of voltage controlled oscillators (VCOs) through the use of a differential signal.

BACKGROUND OF THE INVENTION

A voltage controlled oscillator (VCO) provides a frequency that is adjustable via a control voltage input. With reference to FIG. 1, there is illustrated a diagram of a VCO circuit 10 that is commonly implemented to achieve such adjustability. The voltage controlled oscillator 10 is formed of a variable capacitor (C) 11, or varactor, in parallel with a fixed inductor (L) 13 and an active circuit to generate a negative resistance. The active circuit is formed of two inverters 15 connected in parallel with each other and oriented to permit the flow of current in opposing directions across the varactor 11. Such a circuit type is generally referred to as an LC-VCO 10. LC-VCO 10 has two time varying output voltages, OUTN and OUTP, which are of nearly identical voltage but which are, preferably, 180° out of phase.

LC-VCO circuits are commonly fabricated into integrated circuits for use, among other things, as signal providers, such as clock signals, to high speed serial links.

With reference to FIG. 2, there is illustrated an integrated circuit implementation of an LC VCO using an NCAP 21 as a varactor. An NCAP is a capacitor formed in the n-well of a Field Effect Transistor (FET) to form an accumulation-mode varactor. While illustrated with reference to fabrication in an n-well, an accumulation-mode varactor may be formed in the p-well of an FET to form a PCAP that may be utilized in the same manner as NCAP 21. Each NCAP is formed of a source and drain 25 and a gate 27. The capacitance of the varactor 11 formed of the two NCAPs 21 can be continually and near instantaneously adjusted through the application of a variable control signal 23 applied to the sources and drains 25 of each NCAP 21.

In integrated circuits, it is advantageous to employ differential signals, especially signals that vary in phase by 180°, to provide increased immunity to on-chip noise and signal coupling. With reference to FIG. 3a, there is illustrated an LC-VCO 10 providing differential control of the varactor 11 via a positive voltage control signal VCP and a negative voltage control signal VCN. The idea is extended in FIG. 3b wherein two varactors 11, 11' are connected in anti-parallel. The connection of the two varactors 11, 11' in this manner serves to equalize the parasitic capacitance of the circuit. However, such a connection of the varactors 11, 11' remains sensitive to the common-mode voltage (CMV) of the two control signals VCP and VCN. The CMV is defined to be equal to 0.5×(VCP+VCN) and is set by the output voltage of the previous circuit.

With reference to FIG. 6, there is illustrated a circuit diagram of a LC-VCO 10 and the circuitry which is typically used to control the operation of the LC-VCO 10 known in the art. A phase-locked loop 65 serves to receive the output voltages 17, 17' from the LC-VCO 10 and to provide control voltages VCP, VCN to the LC-VCO. Phase-locked loop 65 utilizes a comparator 61 for receiving as input the output voltages 17, 17' from the LC-VCO, comparing the values of the output voltages 17, 17', and determining an output frequency of the LC-VCO. The comparator 61 outputs a voltage indicative of the output frequency of the LC-VCO which is subsequently communicated to a charge pump 63 via phase-locked loop 65.

More specifically, comparator 61 is typically formed of a chipset or integrated circuit that receives as inputs a reference signal in the form of a clock signal of known frequency (not shown) and the output voltages 17, 17' of the LC-VCO 10. Comparator 61 outputs a voltage indicative of the difference in frequency between the reference frequency and output voltages 17, 17'.

Charge pump 63 receives the voltage signal from the comparator 61 via phase-locked loop 65 as well as a reference voltage Vref. While illustrated as a static input, Vref is typically formed as part of a feedback loop (not shown) which operates to maintain a constant Vref during the operation of the charge pump 63. Without such a feedback loop, anomalies may arise, such as changes in the operating environment temperature, that can cause Vref to drift in an unwanted fashion.

Vref operates as the CMV of the charge pump 63. Charge pump 63 utilizes the inputs so as to output control voltages, VCP and VCN, selected to adjust the capacitance of the varactors 11 of the LC-VCO 10. In this manner, the charge pump 63 provides an output signal to the LC-VCO 10 which serves to adjust the frequency of the output voltages 17, 17' of the LC-VCO 10 which in turn provide feedback 65 to the charge pump 63. This feedback loop allows for the constant adjustment of the operation of the LC-VCO to enable the desired output of the LC-VCO 10.

With reference to FIG. 4, there is illustrated a problem that arises from the traditional configuration illustrated in FIG. 6. With reference to FIG. 4a, there is illustrated the variable capacitance, $C_{var}$, of an exemplary NFET varactor as a function of the difference in voltage applied to the gate side and the drain side of an exemplary NFET varactor, (VG minus VD), where VG is the voltage applied to the gate side of the varactor and VD is the voltage applied to the drain side of the varactor. In operation, a PFET varactor may be similarly utilized.

The resulting curve exhibits a maximum slope when (VG−VD) is equal to zero. The curve asymptotically approaches a maximum capacitance, $C_{max}$, as (VG−VD) increases, and asymptotically approaches a minimum capacitance $C_{min}$ as (VG−VD) decreases. As a result, when (VG−VD) is approximately equal to zero, small changes in VG will result in relatively large changes of $C_{var}$. In operation, VG is equal to the CMV of the VCO across the cross-coupled inverters 15. VD is equal to the CMV of the charge pump 63. As VG assumes a value different from VD, changes in VG result in relatively smaller changes in $C_{var}$.

With reference to FIG. 4b, there is illustrated a circuit diagram of a representative varactor 11 with two control voltages $V_{cn}$ and $V_{cp}$. As discussed above, $V_{cn}$ and $V_{cp}$, form the CMV of the output of the charge pump which is equal to Vref. With reference to FIG. 4b there are superimposed two capacitance response curves 71, 73. Curve 71 is a plot of capacitance versus $V_{cn}$ and curve 73 is a plot of capacitance versus $V_{cp}$.

In operation, the difference between the CMV of the charge pump and the CMV of the negative-resistance cell, spanning the inverters of the LC-VCO, in the VCO appear as an offset, ΔCM, in the capacitance-vs-voltage characteristic of a combined varactor pair as illustrated in FIG. 4b. In such a scenario, the control voltages, $V_{cp}$ and $V_{cn}$, are displaced to points along response curves 71, 73 closer to the asymptotic portions of each curve 71, 73. As a result, changes in $V_{cp}$ and $V_{cn}$ result in relatively small changes to the capacitance of the varactor 11.

Typically, during the design phase of such a circuit, the CMV of the VCO and the CMV of the charge pump are designed to be equal. However, during operation, differences between the two CMVs can arise as a result of thermal fluctuations and the like. This in turn can cause the offset voltage experienced by the varactors, ΔCM, to limit the ability to control the LC-VCO through the adjustment of the differential control signals, Vcn and Vcp.

This attribute of LC-VCO circuits known in the art results in undesirable difficulty in controlling the signal frequency output of the VCO using differential control signals 23.

SUMMARY OF THE INVENTION

In accordance with an embodiment of the present invention, a method of differentially controlling an LC voltage controlled oscillator (VCO) comprises providing an LC-VCO comprising at least one inductor, measuring an inductor common voltage (CMV) output at a point along the at least one inductor, utilizing the measured inductor CMV as an input to a charge pump, and outputting from the charge pump a plurality of differential control voltages to control an output of the LC-VCO.

In accordance with an alternative embodiment of the present invention, an LC-VCO comprises at least two varactors, a plurality of control voltage inputs for controlling the at least two varactors, at least one inductor in parallel with the at least two varactors, at least two cross-coupled inverters, and an inductor CMV output in contact with the at least one inductor for measuring a LC-VCO CMV across the at least two cross-coupled inverters.

In accordance with an alternative embodiment of the present invention, An LC-VCO comprises at least two varactors, a plurality of control voltage inputs for controlling the at least two varactors, at least one inductor in parallel with the at least two varactors, at least two cross-coupled inverters, and means for measuring a LC-VCO CMV across the at least two cross-coupled inverters.

In accordance with an alternative embodiment of the present invention, a method of differentially controlling an LC voltage controlled oscillator (VCO) comprises measuring an inductor CMV output of the LC-VCO, measuring an output frequency of the LC-VCO, and utilizing the inductor CMV and the output frequency to provide a plurality of differential control voltages for the LC-VCO.

In accordance with an alternative embodiment of the present invention, an apparatus for differentially controlling an LC-VCO comprises means for measuring an inductor CMV output of the LC-VCO, means for measuring an output frequency of the LC-VCO; and means for utilizing the inductor CMV and the output frequency to provide a plurality of differential control voltages for the LC-VCO.

BRIEF DESCRIPTION OF THE DRAWINGS

FIG. 1 is a circuit diagram of a LC voltage controlled oscillator (LC-VCO) known in the art.

FIG. 2 is a circuit diagram of a LC-VCO with n-well capacitors known in the art.

FIG. 3a is a schematic diagram of an LC-VCO known in the art incorporating differential control.

FIG. 3b is a schematic diagram of an LC-VCO known in the art incorporating two pairs of varactors connected in anti-parallel known in the art.

DETAILED DESCRIPTION OF THE INVENTION

In an embodiment of the present invention, there is provided a LC-VCO circuit that does not experience an offset in the perceived capacitance-versus-voltage of a varactor utilized to control the signal frequency output of the LC-VCO.

Figure 4A:
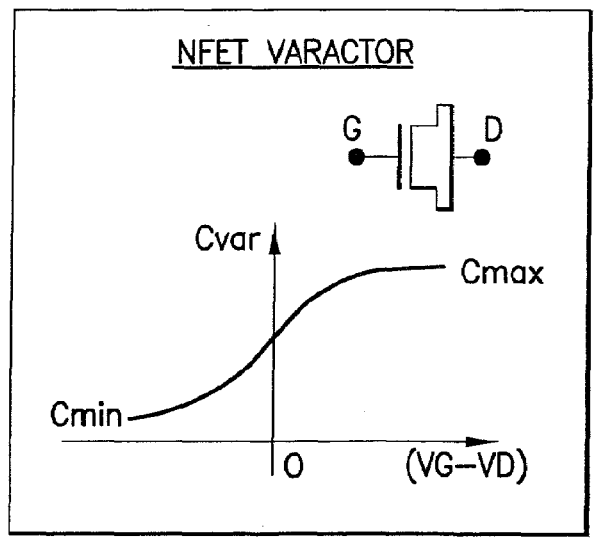
FIG. 4a is a graph of the capacitance response of an NFET varactor known in the art.
Figure 4B:
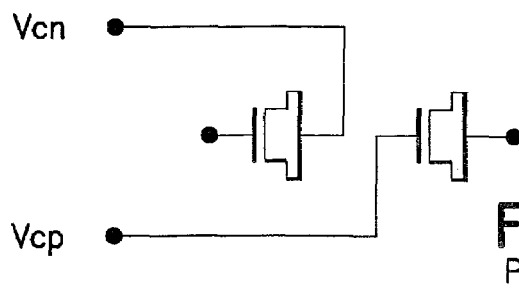
FIG. 4b is a diagram of a varactor known in the art.
Figure 4C:
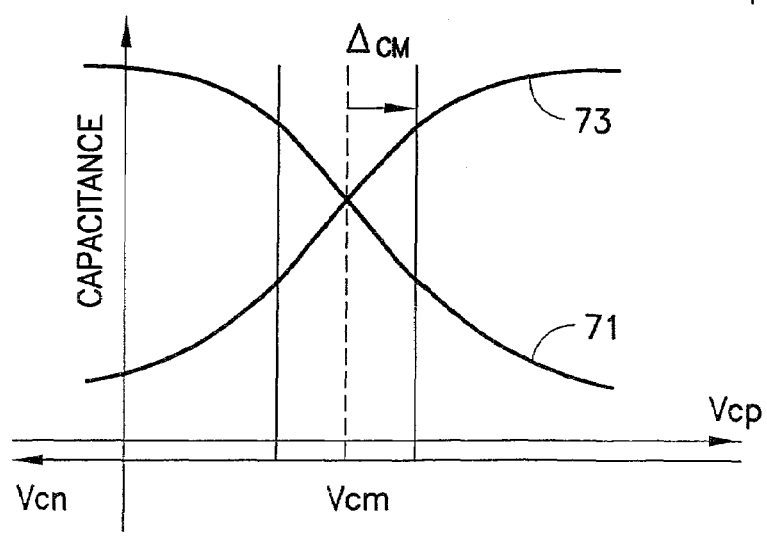
FIG. 4c is a graph of a superposition of the differential voltages applied to a LC-VCO known in the art.
Figure 5:
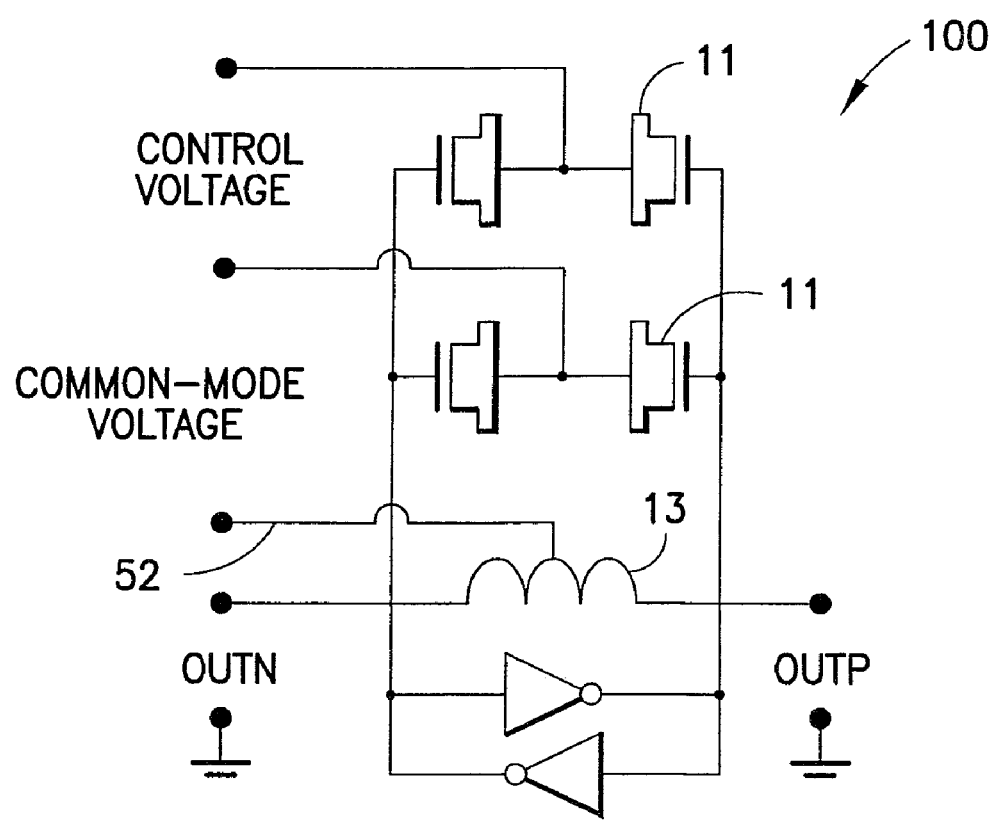
FIG. 5 is a diagram of an embodiment of an LC-VCO according to the present invention.
Figure 6:
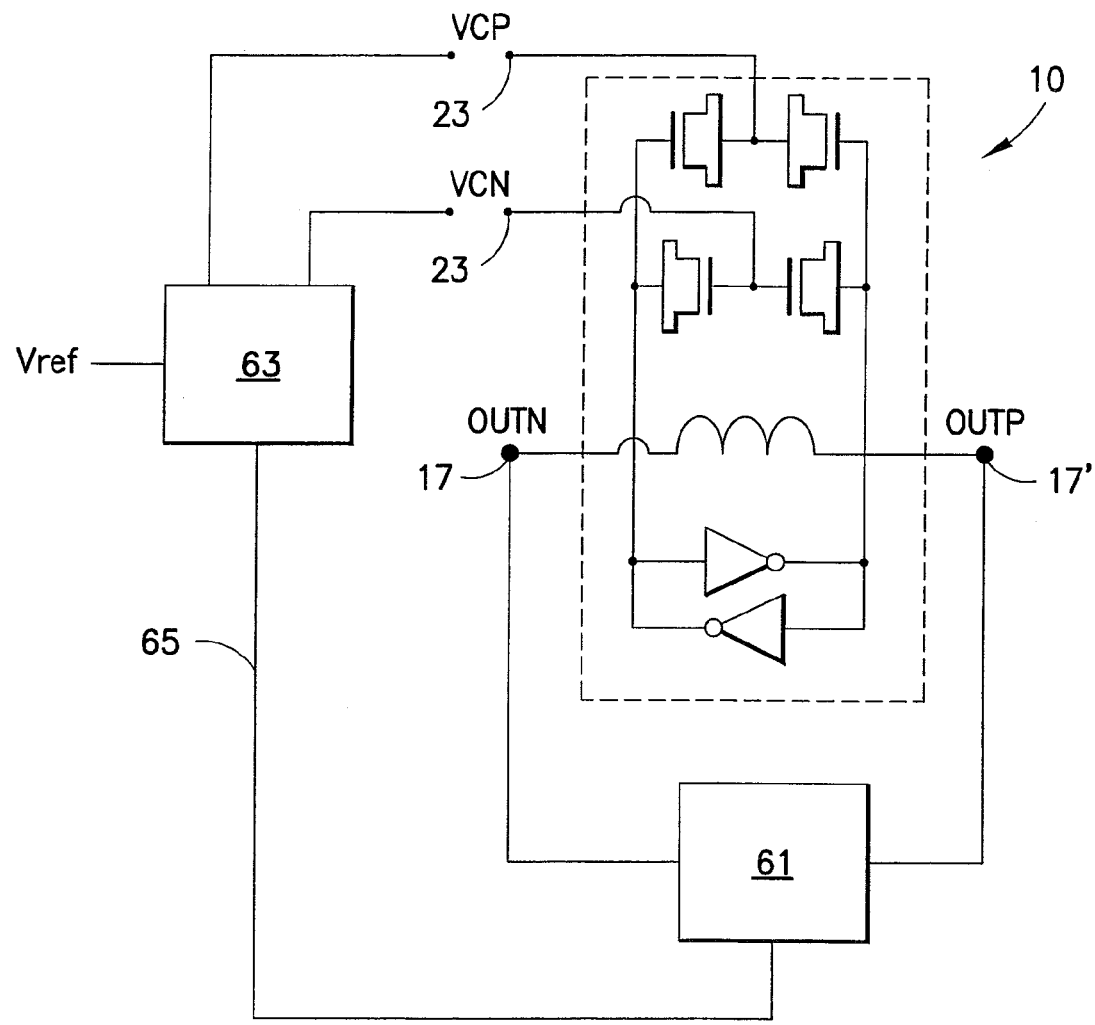
FIG. 6 is a circuit diagram of an LC-VCO and a charge pump known in the art.

With reference to FIG. 5, there is illustrated an embodiment of an LC-VCO 100 of the present invention. As illustrated, LC-VCO 100 is formed of a pair of varactors 11 connected in anti-parallel, an inductor 13 connected in parallel with the varactors 11, and two inverters 15 connected in parallel with the inductor 13. While the LC-VCO 100 is similar in construction to the LC-VCO 10 of FIG. 3b known in the art, LC-VCO 100 is not so limited. Rather, LC-VCO 100 may assume any construction including, but not limited to, that of FIG. 3a, that utilizes one or more varactors for receiving differential control voltages in parallel with at least one inductor 13 and at least two invertors 15 in parallel with the at least one inductor 13. As noted above, VCOs are typically fabricated into integrated chips. When so constructed, each varactor 11 may incorporated either p-well capacitors, n-well capacitors or a combination of the two.

In the embodiment illustrated, LC-VCO 100 makes use of an additional circuit component, an inductor CMV output 52, so as to substantially reduce or eliminate any offset between the CMV of the charge pump and the CMV of the LC-VCO. As used herein "inductor CMV output" refers to the voltage, corresponding to the CMV of the VCO, sensed along an inductor or series of inductors. As such, the inductor CMV output is measured or otherwise sensed at a point such that the sensed voltage approximates the CMV of the VCO.

Inductor CMV output 52 is therefore sensed so as to approximate the CMV of LC-VCO 100. Preferably, inductor CMV output 52 is sensed at a center tap point of inductor 13. As used herein, "center tap point" refers to a physical point on an inductor, or along multiple inductors connected in series, whereat the voltage is approximately midway between the voltages at either end of the inductor or along the multiple inductors. In this manner, inductor CMV output 52 preferably acts to approximate the CMV of the LC-VCO 100 set by the cross-coupled inverters 15. As discussed above, the CMV is computed as the average, or midpoint, between two voltages. By sensing a voltage at a midpoint of an inductor 13, the inductor 13 acts to physically provide a calculation of the CMV. As noted above, the inductor 13 may be formed of a number of inductors 13 in series. In such an instance, the inductor CMV is measured at a point such that the measured inductor CMV is approximately equal to an average of the voltage at either extreme of the series of inductors.

Regardless of the configuration, inductor CMV output 52 is preferably sensed at a point located along the expanse formed from an inductor or inductors 13 such that the sensed voltage of the inductor is approximately equal to the CMV of the VCO set by the cross-coupled inverters 15.

Figure 7:
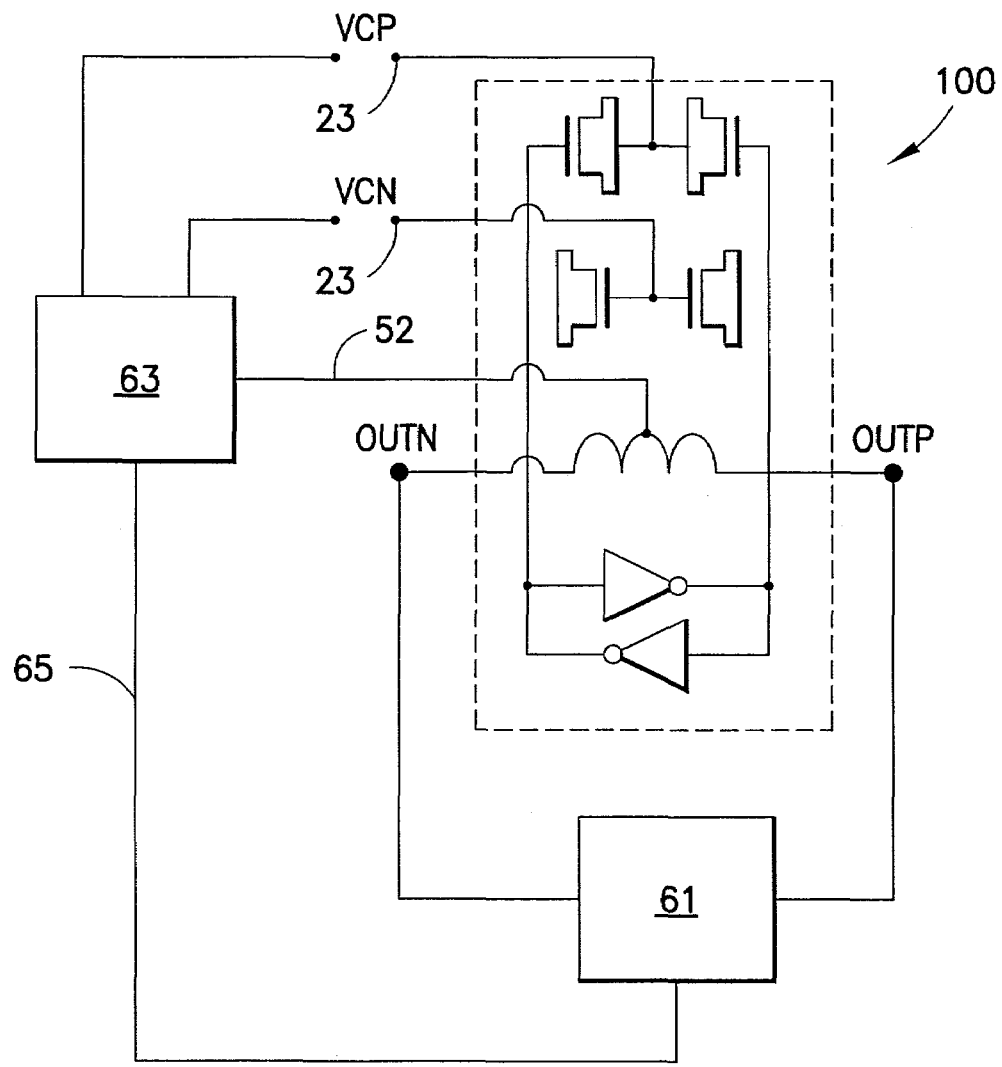
FIG. 7 is a circuit diagram of an embodiment of an LC-VCO of the present invention and a charge pump.

With reference to FIG. 7, there is illustrated the interaction of inductor CMV output 52 with the charge pump 63 via phase-locked loop 65. As is evident, inductor CMV output 52 serves as the reference voltage to charge pump 63. Inductor CMV output 52 acts in concert with phase-locked loop 65 to provide feedback to charge pump 63 for adjusting control signals 23. Preferably, control signals 23 are formed of a differential pair of control voltages. However, control signal 23 may likewise be formed of a current control signal. As a result, VD is forced to be approximately equal to VG. Therefore, (VG–VD) is forced to be approximately equal to zero. Such an arrangement avoids the appearance of an offset in the capacitance-vs-voltage characteristic of the varactors of the LC-VCO.

While there has been illustrated and described what is at present considered to be a preferred embodiment of the claimed invention, it will be appreciated that numerous changes and modifications are likely to occur to those skilled in the art. It is intended in the appended claims to cover all those changes and modifications that fall within the spirit and scope of the claimed invention.

What is claimed is:

1. A method of controlling an LC voltage controlled oscillator (VCO) comprising;
   providing an LC-VCO comprising at least one inductor;
   sensing an inductor common mode voltage (CMV) output at a point along said at least one inductor;
   utilizing said measured inductor CMV as an input to a charge pump; and
   outputting from said charge pump a differential control signal to control an output of said LC-VCO.

2. The method of claim 1 wherein said differential control signal is applied as inputs to at least two varactors.

3. The method of claim 2 wherein said at least two varactors comprise NFET varactors.

4. The method of claim 2 wherein said at least two varactors comprise PFET varactors.

5. The method of claim 1 wherein said differential control signal is applied to two pairs of varactors coupled in anti-parallel fashion.

6. The method of claim 1 wherein said output of said LC-VCO comprises a clock signal to a serial link.

7. An LC-VCO comprising:
   at least two varactors;
   a plurality of control signals for controlling said at least two varactors;
   at least one inductor in parallel with said at least two varactors said at least one inductor having a center tap point;
   at least two cross-coupled inverters coupled in parallel with said at least one inductor; and
   a circuit having an input coupled to said at least one inductor center tap point for determining a LC-VCO common mode voltage across said at least two cross-coupled inverters.

8. The LC-VCO of claim 7 comprising two output voltages approximately 180 degrees out of phase.

9. The LC-VCO of claim 7 wherein said two output voltages comprise a clock signal to a serial link.

10. An LC-VCO comprising:
    at least two varactors;
    a plurality of control signals for controlling said at least two varactors;
    at least one inductor in parallel with said at least two varactors;
    at least two cross-coupled inverters in parallel with said at least one inductor; and
    means for sensing a LC-VCO common mode voltage at a point between ends of said at least one inductor, said means for sensing coupled to the plurality of control signals.

11. The LC-VCO of claim 10 comprising two output voltages approximately 180 degrees out of phase.

12. A method of controlling an LC voltage controlled oscillator (VCO) comprising;
    sensing an inductor a-common mode voltage (CMV) output at a point between ends of an inductor or series of inductors of said LC-VCO;
    determining an output frequency of said LC-VCO; and
    utilizing said inductor CMV output and said output frequency to provide a control signal for said LC-VCO.

13. A method of controlling an LC voltage controlled oscillator (VCO) comprising;
    sensing an inductor a common mode voltage (CMV) output of said LC-VCO;
    detennining an output frequency of said LC-VCO; and
    utilizing said inductor CMV output and said output frequency to provide a control signal for said LC-VCO wherein said sensing said inductor CMV output comprises sensing said inductor CMV output at a center tap point of an inductor.

14. A method of controlling an LC voltage controlled oscillator (VCO) comprising;

sensing an inductor a common mode voltage (CMV) output of said LC-VCO;

determining an output frequency of said LC-VCO; and utilizing said inductor CMV output and said output frequency to provide a control signal for said LC-VCO wherein said sensing said inductor CMV output comprises sensing said inductor CMV output at a point along a plurality of inductors such that said inductor CMV output is approximately equal to a CMV across a plurality of cross-coupled inverters coupled in parallel to said plurality of inductors.

15. A method of controlling an LC voltage controlled oscillator (VCO) comprising;

sensing an inductor acommon mode voltage (CMV) output of said LC-VCO;

determining an output frequency of said LC-VCO; and utilizing said inductor CMV output and said output frequency to provide a control signal for said LC-VCO wherein said utilizing comprises utilizing said inductor CMV output and said output frequency as a plurality of inputs to a charge pump.

16. The method of claim 15 comprising outputting said control signal from said charge pump.

17. An apparatus for controlling an LC-VCO comprising;

means for sensing an inductor common mode voltage (CMV) output at a point between ends of an inductor or series of inductors of said LC-VCO;

means for determining an output frequency of said LC-VCO; and means for utilizing said inductor CMV output and said output frequency to provide a plurality of differential control voltages for said LC-VCO.

18. The apparatus of claim 17 wherein said means for utilizing comprises a charge pump.

19. The apparatus of claim 18 wherein said output frequency is communicated to said means for utilizing via a phase-locked loop.

20. The apparatus of claim 17 disposed on an integrated circuit.

* * * * *